(12) United States Patent
Liu et al.

(10) Patent No.: US 12,290,010 B2
(45) Date of Patent: Apr. 29, 2025

(54) METHOD FOR MANUFACTURING A CONDUCTIVE BRIDGING MEMORY DEVICE

(71) Applicant: National Yang Ming Chiao Tung University, Hsinchu (TW)

(72) Inventors: Po-Tsun Liu, Hsinchu (TW); Chih-Chieh Hsu, Taoyuan (TW); Kai-Jhih Gan, Kaohsiung (TW)

(73) Assignee: National Yang Ming Chiao Tung University, Hsinchu (TW)

( * ) Notice: Subject to any disclaimer, the term of this patent is extended or adjusted under 35 U.S.C. 154(b) by 589 days.

(21) Appl. No.: 17/464,601

(22) Filed: Sep. 1, 2021

(65) Prior Publication Data
US 2022/0302386 A1  Sep. 22, 2022

(30) Foreign Application Priority Data
Mar. 16, 2021  (TW) .................. 110109341

(51) Int. Cl.
*H10N 70/00* (2023.01)
*G11C 13/00* (2006.01)
*H10B 63/00* (2023.01)

(52) U.S. Cl.
CPC ....... *H10N 70/021* (2023.02); *G11C 13/0011* (2013.01); *H10B 63/80* (2023.02); *H10N 70/841* (2023.02); *H10N 70/883* (2023.02)

(58) Field of Classification Search
CPC .. H10N 70/021; H10N 70/245; H10N 70/826; H10N 70/8833; H10N 70/041; H10N 70/043; H10N 70/046; H10N 70/028; H10N 70/883; H10N 70/8836; H10N 70/24; H10N 70/841; H10N 70/8416; H10B 63/80; H10B 63/82; H10B 63/84; G11C 13/0011; G11C 2213/15
See application file for complete search history.

(56) References Cited

U.S. PATENT DOCUMENTS 9,508,425 B2   11/2016   Lu et al.
9,722,179 B2   8/2017   Paz de Araujo et al.
(Continued)

FOREIGN PATENT DOCUMENTS

TW   201442310    11/2014
TW   I597834 B    9/2017

OTHER PUBLICATIONS

"Effect of tungsten doping on the variability of InZnO conductive-bridging random access memory" Nanotechnology 32 (2021) 035203 (pp. 1-6) (Year: 2021).*
Meng Qi et al., "Highly uniform switching of HfO2-x based RRAM achieved through Ar plasma treatment for low power and multilevel storage," Applied Surface Science, 458, 2018, pp. 216-221.
(Continued)

*Primary Examiner* — Latanya N Crawford Eason
(74) *Attorney, Agent, or Firm* — Fish & Richardson P.C.

(57) ABSTRACT

A method for manufacturing a conductive bridging memory device includes the following steps. First, a bottom electrode is formed on a substrate. Next, a switching layer is formed on the bottom electrode. The switching layer is made of a semiconducting metal oxide and free of gallium. Then, a surface of the switching layer is subjected to an oxygen plasma surface treatment. Afterwards, a blocking layer including a conductive material is formed on the treated surface of the switching layer, and an upper electrode is formed on the blocking layer.

15 Claims, 8 Drawing Sheets

(56) References Cited

U.S. PATENT DOCUMENTS

| | | | | |
|---|---|---|---|---|
| 2008/0002458 | A1* | 1/2008 | Bae | G11C 13/00 |
| | | | | 257/E27.071 |
| 2008/0094875 | A1* | 4/2008 | Ho | G11C 13/0016 |
| | | | | 365/163 |
| 2009/0020745 | A1* | 1/2009 | Jeong | G11C 13/003 |
| | | | | 257/E47.001 |
| 2011/0089393 | A1* | 4/2011 | Chang | H10N 70/20 |
| | | | | 257/43 |
| 2012/0261637 | A1* | 10/2012 | Liu | H10N 70/8416 |
| | | | | 257/4 |
| 2016/0336510 | A1 | 11/2016 | Park | |
| 2019/0036020 | A1* | 1/2019 | Majhi | H10N 70/826 |
| 2019/0348466 | A1 | 11/2019 | Pillarisetty et al. | |
| 2020/0160806 | A1 | 5/2020 | Guo et al. | |
| 2020/0161372 | A1* | 5/2020 | Beckmann | H10N 70/063 |
| 2020/0265763 | A1 | 8/2020 | Shang et al. | |
| 2022/0068379 | A1* | 3/2022 | Kim | G11C 13/004 |

OTHER PUBLICATIONS

Li Zhang et al., "Resistive switching performance improvement of InGaZnO-based memory device by nitrogen plasma treatment," Journal of Materials Science & Technology, 49, 2020, pp. 1-6.

Ishan Varun et al., "Investigation of resistive switching in PVP and ultra-thin HfOx based bilayer hybrid RRAM," Solid State Ionics, 325, 2018, pp. 196-200.

Asif Ali et al., "Dependence of InGaZnO and SnO2 thin film stacking sequence for the resistive switching characteristics of conductive bridge memory devices," Applied Surface Science, 525, 2020, pp. 1-8.

Jewoo Seong et al., "Multi-bit MIP(Memory in Pixel)-based Pixel Circuit of CMOS Backplane for Micro-LED Display," The Society for Information Display (SID), 25(1), 2020, pp. 359-362.

Yoko Fukunaga et al., "Low Power, High Image Quality Color Reflective LCDs Realized by Memory-in-Pixel Technology and Optical Optimization Using Newly-Developed Scattering Layer," The Society for Information Display (SID), 50(3), 2013, pp. 701-704.

* cited by examiner

METHOD FOR MANUFACTURING A CONDUCTIVE BRIDGING MEMORY DEVICE

CROSS-REFERENCE TO RELATED APPLICATION

This application claims priority of Taiwanese Invention Patent Application No. 110109341, filed on Mar. 16, 2021.

FIELD

The disclosure relates to a method for manufacturing a memory device, and more particularly to a resistive memory device.

BACKGROUND

As display panel industry matures, the market demands display panels that have higher resolutions and larger sizes. In turn, memory devices disposed in the display panels are required to process massive amount of data and therefore have to be continuously operated under high driving current. In addition, in order to enhance resolution of images and reduce the size of the devices, conventionally, a thin-film transistor is disposed in each of the pixels of the display panels, and a switching layer of a resistive memory device is connected in series with an active channel of the thin film transistor to form a one-transistor one-resistor (1T1R) structure.

Amorphous metal oxides, which are known to have high carrier migration rate, high light transmittance and low-temperature film-forming properties, are promising materials for making the switching layer of the resistive memory device. Among which, amorphous indium zinc oxides, such as indium gallium zinc oxide (a-IGZO), indium tungsten zinc oxide (a-IWZO) and indium tin zinc oxide (a-ITZO) draw attention because of their superior current driving capability and stable thin film forming property.

However, since the resistive memory device is required to carry increasing driving current and be operated under quick transition between high-resistance-state (HRS) and low-resistance-state (LRS), problems of fluctuating resistive switching parameters and unsatisfactory endurance may arise. In addition, the switching layer made of indium zinc oxide may have far more oxygen vacancies for carrier migration formed on a surface of the switching layer than within the switching layer, which might lead to current overshoot when a voltage is applied, thereby reducing the service life of the device. Therefore, it is important to improve stability of the current resistive memory device in order to prolong the service life of the device.

SUMMARY

Therefore, an object of the disclosure is to provide a method for manufacturing a conductive bridging memory device that can alleviate at least one of the drawbacks of the prior art.

According to this disclosure, the method includes the steps of:
 (a) forming a bottom electrode on a substrate;
 (b) forming a switching layer on the bottom electrode, the switching layer being made of a semiconducting metal oxide and free of gallium;
 (c) subjecting a surface of the switching layer to an oxygen plasma surface treatment;
 (d) forming a blocking layer on the treated surface of the switching layer, the blocking layer including a conductive material; and
 (e) forming an upper electrode on the blocking layer.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
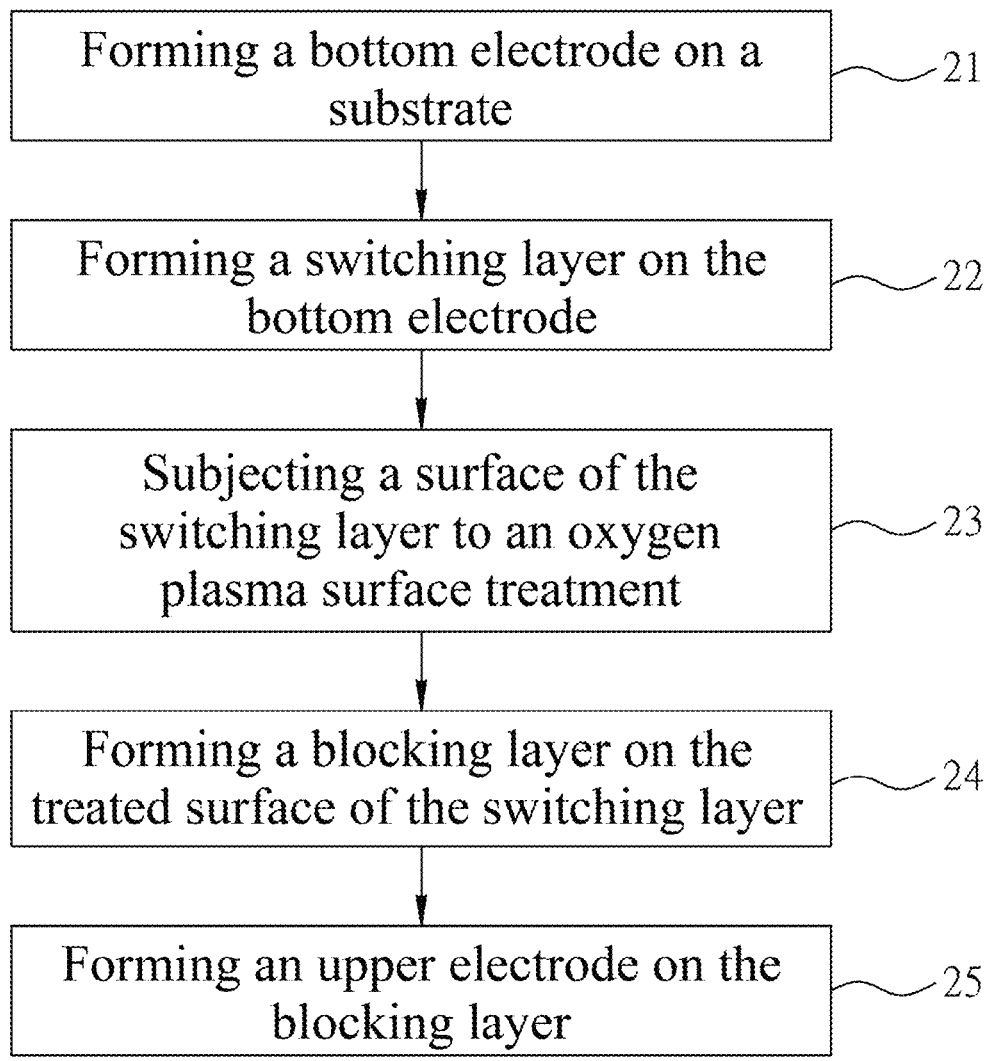
FIG. 1 is a flow chart illustrating consecutive steps of an embodiment of a method for manufacturing a conductive bridging memory device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
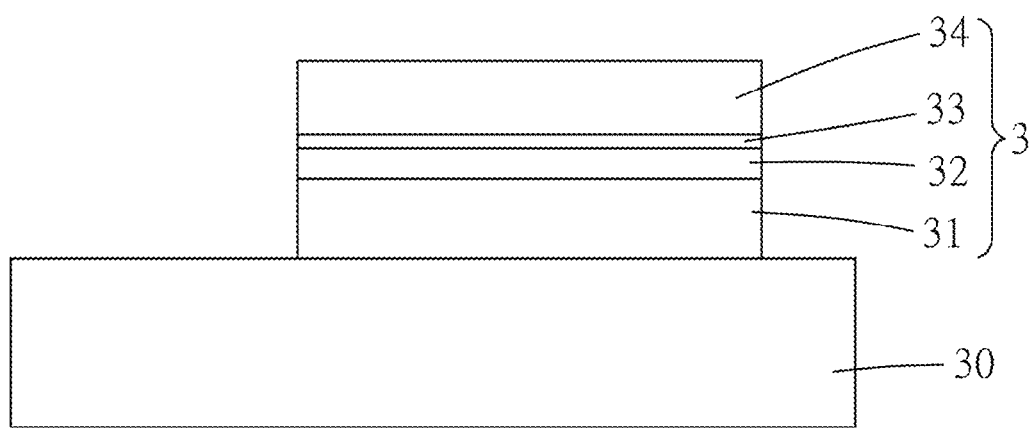
FIG. 2 is a schematic view illustrating the conductive bridging memory device manufactured by the method according to the disclosure disposed on a substrate.

Referring to FIG. 1, the disclosure provides an embodiment of a method for manufacturing a conductive bridging memory device 3 shown in FIG. 2.

The conductive bridging memory device 3 includes a bottom electrode 31, a switching layer 32, a blocking layer 33, and an upper electrode 34 that are sequentially disposed on a substrate 30 in such order.

The bottom electrode 31 includes a first metallic material, which may be a relatively inert conductive material. Examples of the first metallic material may include, but are not limited to, platinum, palladium, and tungsten. The bottom electrode 31 may have a thickness ranging from 80 nm to 100 nm. In this embodiment, the bottom electrode 31 includes platinum, and has a thickness of approximately 80 nm.

The switching layer 32 is made of a semiconducting metal oxide that is free of gallium, such as indium tungsten zinc oxide. The semiconducting metal oxide may be amorphous. The switching layer 32 may have a thickness ranging from 8 nm to 12 nm. In this embodiment, the switching layer 32 includes amorphous indium tungsten zinc oxide, and has a thickness of approximately 8 nm.

The blocking layer 33 includes a conductive material. Examples of the conductive material for making the blocking layer 33 may include, but are not limited to, titanium tungsten, titanium, and titanium nitride. The blocking layer 33 may have a thickness ranging from 1 nm to 2.5 nm. In this embodiment, the blocking layer 33 includes titanium tungsten, and has a thickness of approximately 1 nm.

The upper electrode 34 includes a second metallic material having a higher activity than that of the first metallic material, which is conducive for the upper electrode 34 to release metal ions when a positive bias voltage is applied thereto. Examples of the second metallic material may include, but are not limited to, copper, silver, and gold. The upper electrode 34 may have a thickness ranging from 80 nm to 100 nm. In this embodiment, the upper electrode 34 includes copper, and has a thickness of approximately 80 nm.

When the conductive bridging memory device is in use, during the SET process, a positive bias voltage ($V_{SET}$) is applied to the upper electrode 34, the upper electrode undergoes oxidation to release metal ions (i.e., copper ions in this embodiment) that drift toward the bottom electrode 31 due to the electric field and reach the blocking layer 33. The blocking layer 33 can serve as a buffer region to prevent a large amount of copper ions from entering the switching layer 32 within a short period, so as to avoid damage to the conductive bridging memory device 3 from a sudden voltage drop between the upper electrode 34 and the switching layer 32. Then, the copper ions reaching the switching layer 32 migrate to the bottom electrode 31 along the conductive pathways formed by the oxygen vacancies of the switching layer 32, and are reduced to copper metal deposited at the bottom electrode 31, so as to form conductive filaments (Cu filaments) between the upper electrode 34 and the bottom electrode 31. As a result, the conductive bridging memory device 3 is at low-resistance-state (LRS).

During the RESET process, when a negative bias voltage ($V_{RESET}$) is applied to the upper electrode 34, a Joule Heating effect is induced to rupture the conductive filaments near the bottom electrode 31, and the conductive bridging memory device 3 is switched back to high-resistance-state (HRS). By adjusting the applied voltage, transition of the conductive bridging memory device 3 between the LHS and the RHS can be well controlled.

According to this disclosure, the embodiment of the method for manufacturing the above mentioned conductive bridging memory device 3 includes the following steps 21 to step 25.

In step 21, the bottom electrode 31 is formed on the substrate 30 by, e.g., sputtering deposition.

The substrate 30 may be made of a desired material according to practical needs. In certain embodiments, the substrate 30 may be a hard substrate such as a quartz substrate or a sapphire substrate. In other embodiments, the substrate 30 may be flexible glass, or a soft substrate made of polymeric materials. In this embodiment, the substrate 30 is a silicon substrate formed with a titanium metal layer (not shown in figures) to enhance bonding between the substrate 30 and the bottom electrode 31. The titanium metal layer may have a thickness ranging from 5 nm to 6 nm.

In step 22, the switching layer 32 is formed on the bottom electrode 31 opposite to the substrate by, e.g., sputtering deposition.

In this embodiment, the switching layer 32 is made of amorphous indium tungsten zinc oxide. Since indium zinc oxide is highly light transmissible, it is advantageous for the conductive bridging memory device 3 to be applied in a display panel or in an integrated circuit. In addition, indium zinc oxide has an excellent carrier migration rate which favors formation and rupture of conductive filaments in the switching layer 32 when a bias voltage is applied to the conductive bridging memory device 3. Furthermore, relatively high bond dissociation energy between tungsten and oxygen allows the switching layer 32 to form fewer oxygen vacancies, such that the conductive filaments can be formed in the switching layer 32 in a controlled manner to improve the stability of the conductive bridging memory device 3. If conduction filaments are formed too dense, current passing through the switching layer 32 would be too large, which may cause damage to the conductive bridging memory device 3. In addition, since tungsten is more readily accessible when compared to other trace elements such as gallium which is not used in this embodiment, the switching layer 32 may be made in a manner that reduces manufacturing costs.

In step 23, a surface of the switching layer 32 is subjected to an oxygen plasma surface treatment, which may be conducted under a pressure that is not greater than $5\times10^{-1}$ Torr.

Specifically, the surface of the switching layer 32 is exposed to an oxygen plasma which is generated by subjecting a reactant gas mixture that includes oxygen to an electric field in a vacuum environment. The reactant gas mixture may also include an inert carrier gas, such as argon. In the reactant gas mixture, oxygen may be present in an amount that ranges from 8% to 34% based on the total volume of the reactant gas mixture. When the amount of oxygen in the reactant gas mixture is too low, the oxygen plasma surface treatment is ineffective for reducing the amount of oxygen vacancies on the surface of the switching layer 32. When the amount of oxygen present in the reactant gas mixture is above 34%, the oxygen plasma surface treatment may remove too many oxygen vacancies on the surface of the switching layer 32 to form sufficient conduction filaments between the upper electrode 34 and the bottom electrode 31, which may result in ineffective switching between the high-resistance-state and the low-resistance-state of the conductive bridging memory device 3. In this embodiment, the amount of oxygen in the reactant gas mixture is 33%. The oxygen plasma surface treatment is conducted by placing the product obtained in step 22 in a chamber (not shown in figures) that is vacuumed to have a background pressure ranging from $2.5\times10^{-2}$ Torr to $7\times10^{-2}$ Torr. Then, argon gas is introduced into the chamber at a flow rate ranging from 200 SCCM to 210 SCCM, and oxygen gas is introduced into the chamber at a flow rate ranging from 20 SCCM to 100 SCCM. The resultant reactant gas mixture is subjected to an electric field that is provided by applying a power level that ranges from 120 W to 180 W under a working pressure that is controlled within a range of $2\times10^{-1}$ Torr to $5\times10^{-1}$ Torr. The oxygen plasma is thus formed to treat the surface of the switching layer 32 for a time period ranging from 60 seconds to 150 seconds. The temperature within the chamber is controlled at a temperature ranging from 80° C. to 120° C.

Since oxygen vacancies on the surface of the switching layer 32 are found to be much more abundant than oxygen vacancies within the switching layer 32 due to surface state effect, the oxygen plasma surface treatment is capable of reducing oxygen vacancies on the surface of the switching layer 32 by incorporating oxygen atoms into the oxygen deficient sites. As such, difference between the amount of oxygen vacancies in the interior and that on the surface of the switching layer 32 is reduced, resulting in improved uniformity of the resistive switching parameters.

In step 24, the blocking layer 33 is formed on the treated surface of the switching layer 32 by, e.g., sputtering deposition.

In step 25, the upper electrode is formed on the blocking layer 33 by, e.g., sputtering deposition.

It is noted that since sputtering deposition can be conducted at a temperature ranging from room temperature to 120° C., the choice of material for the substrate 30 may be more flexible. In addition, sputtering deposition is capable of forming films that have a relatively large area, and an accurately controlled film thickness. Therefore, in this embodiment, the bottom electrode 31, the switching layer 32, the blocking layer 33, and the upper electrode 34 are formed by sputtering deposition.

To verify the effect of the oxygen plasma surface treatment on the switching layer 32, the (untreated) surface of the switching layer 32 (i.e., prior to the oxygen plasma surface treatment) and the treated surface of the switching layer 32 (i.e., after the oxygen plasma surface treatment) were subjected to X-ray photoelectron spectroscopy (XPS) to measure elemental composition and chemical state thereof, thereby determining the amount of oxygen vacancies on the surface of the switching layer 32. The oxygen plasma surface treatment was conducted under $3\times10^{-1}$ Torr and at 100° C. for 60 seconds, in which the oxygen plasma was generated from a reactant gas mixture including 33% oxygen (formed by introducing argon at 200 SCCM and oxygen at 100 SCCM into the chamber) under an electric field which was provided by applying a power level of 150 W.

Figure 3:
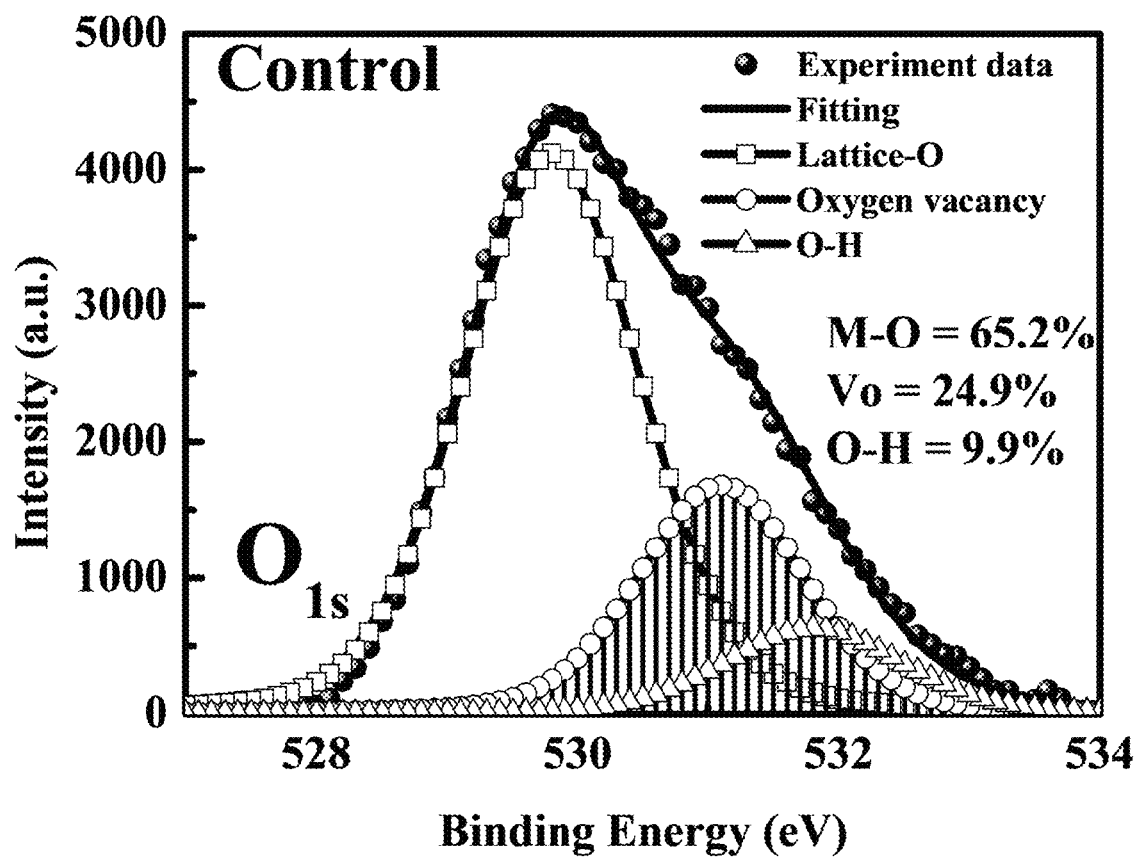
FIG. 3 is an X-ray photoelectron spectroscopy (XPS) spectrum of untreated surface of a switching layer (i.e. prior to oxygen plasma surface treatment)
Figure 4:
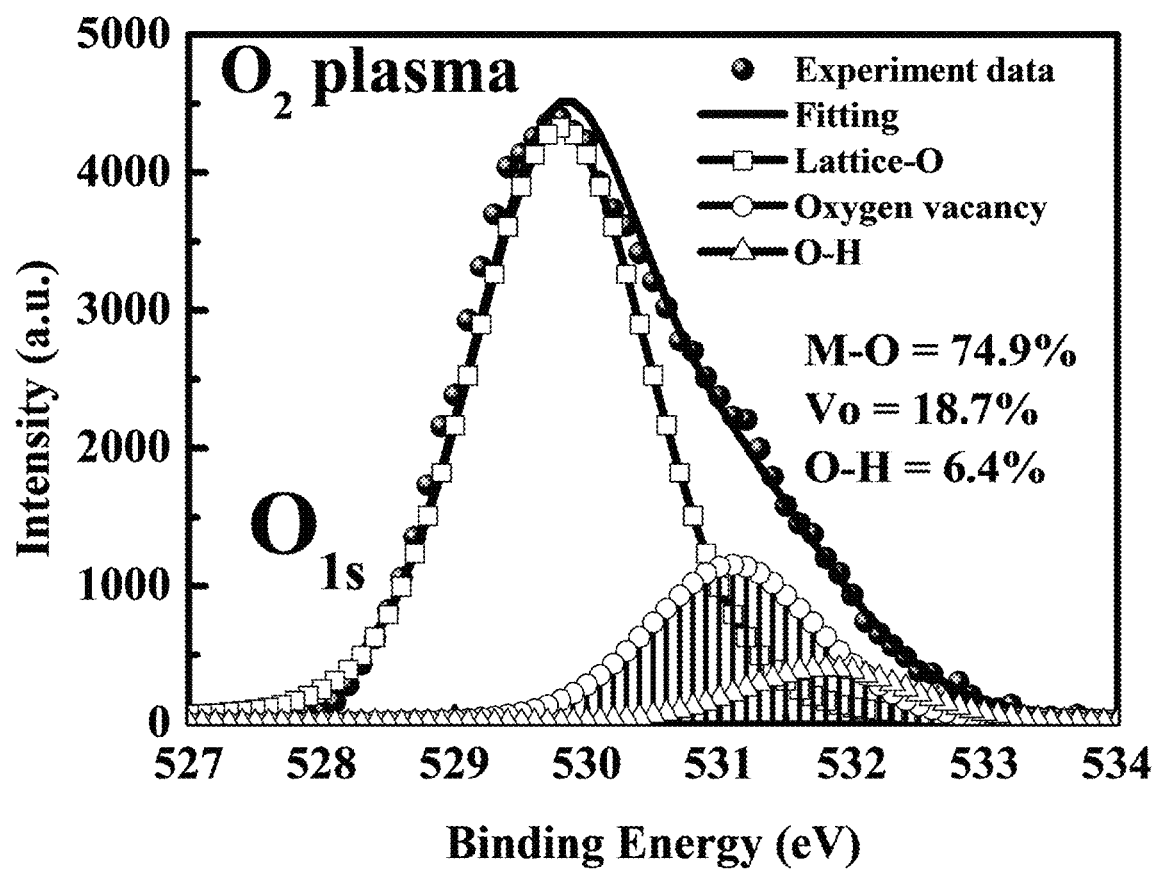
FIG. 4 is an XPS spectrum of treated surface of the switching layer (i.e., after oxygen plasma surface treatment)

As shown in FIGS. 3 and 4, $O_{1s}$ of the untreated surface of the switching layer 32 has a peak value of 4400 a.u., while $O_{1s}$ of the treated surface of the switching layer 32 is increased to reach 4500 a.u. without position shift, indicating that the amount of oxygen ions present on the treated surface of the switching layer 32 increases. In addition, the area under the curve labeled "lattice-O" increases from 65.2% to 74.9% after the oxygen plasma surface treatment, indicating that more metal-oxygen bondings are present on the treated surface of the switching layer 32. The area under the curve labeled "oxygen vacancy" decreases from 24.9% to 18.7% after the oxygen plasma surface treatment, indicating that the amount of oxygen vacancies present on the treated surface of the switching layer 32 decreases. Based on these results, it may be inferred that the oxygen plasma surface treatment is effective in reducing the amount of oxygen vacancies present on the surface of the switching layer 32.

The conductive bridging memory device 3 made by the method of this disclosure which includes the treated switching layer 32 was subjected to 100 cycles of DC positive bias voltage and negative bias voltage, i.e., the transition between high-resistance-state (HRS) and the low-resistance-state (LRS), so as to determine resistive switching performance of the conductive bridging memory device 3. In comparison, a conventional resistive memory device which includes a switching layer that is not subjected to the oxygen plasma surface treatment was subjected to the same analysis. A respective I-V graph for each of the conductive bridging memory device 3 and the conventional resistive memory device was obtained.

Figure 5:
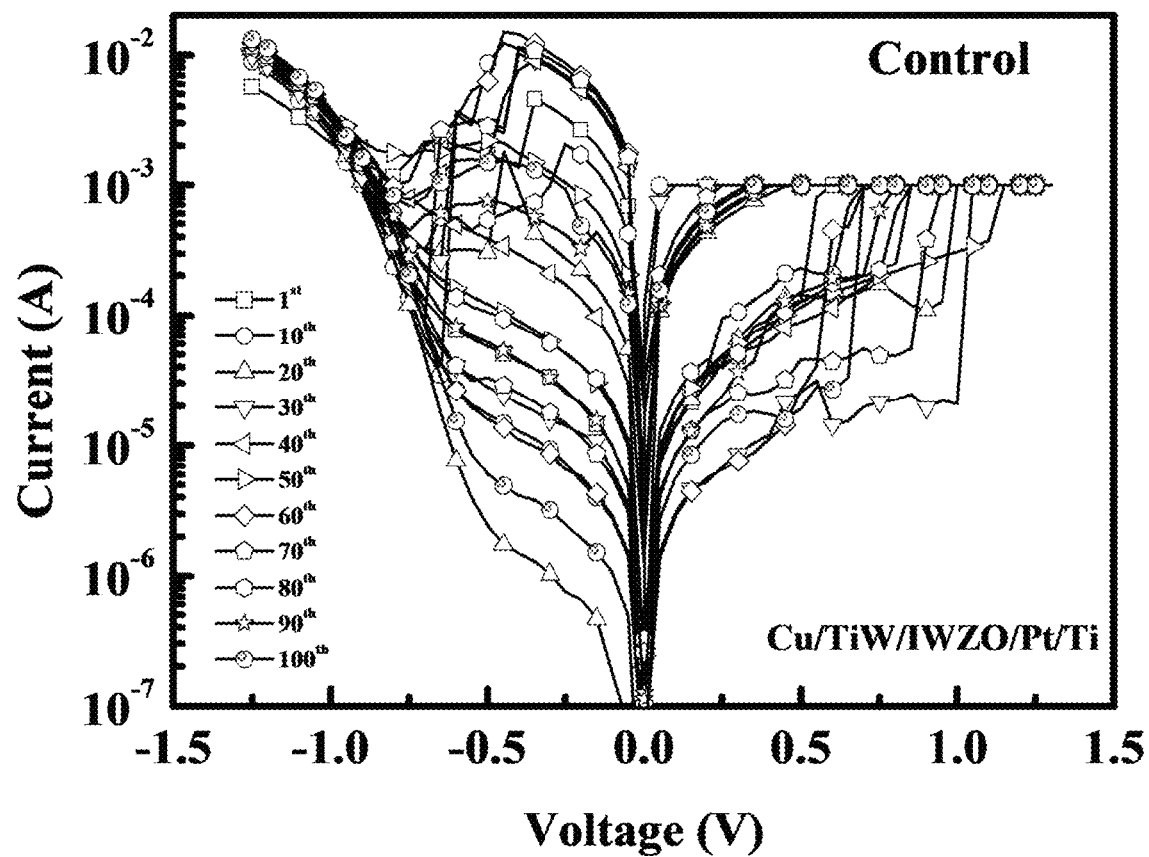
FIG. 5 is a current-voltage curve of a conventional resistive memory device subjected to 100 cycles of DC sweeping.
Figure 6:
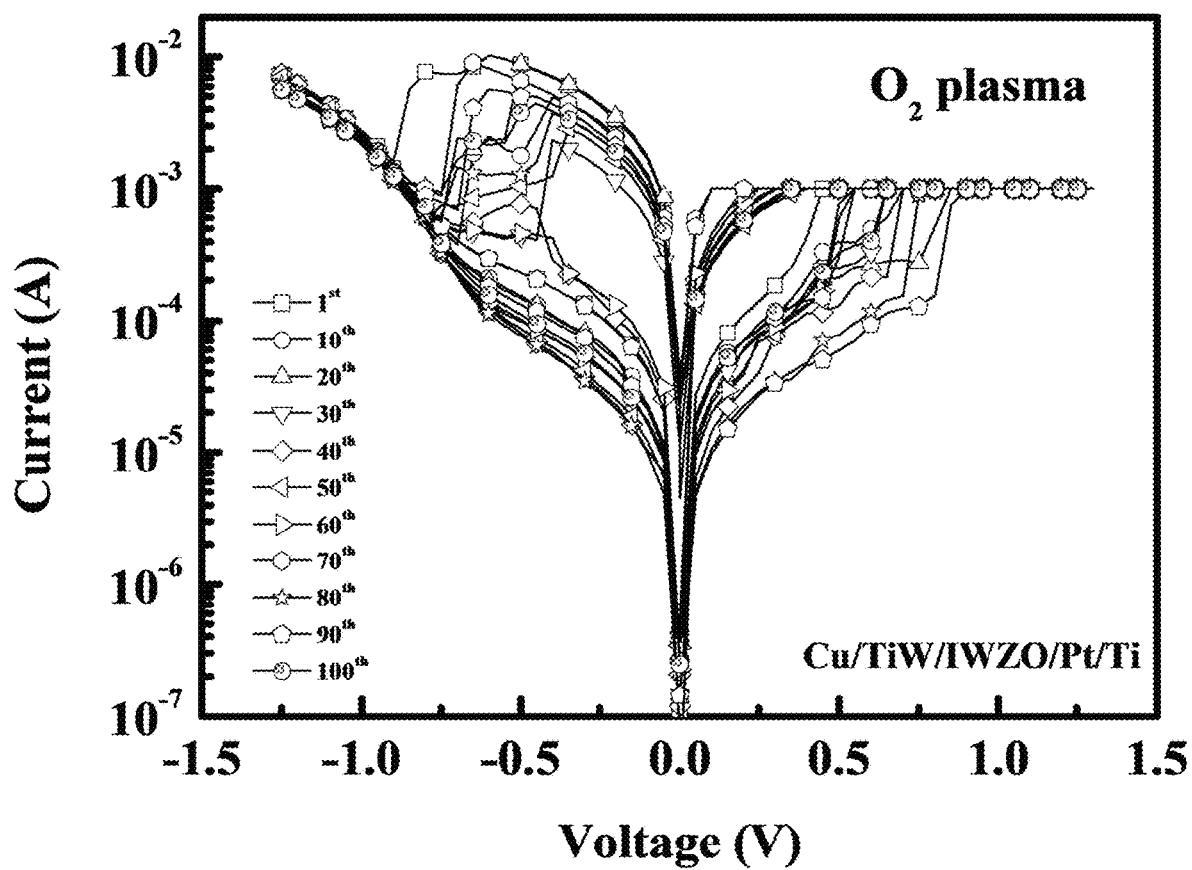
FIG. 6 is a current-voltage curve of the conductive bridging memory device manufactured by the method subjected to 100 cycles of DC sweeping.

Compared to the I-V graph of the conventional resistive memory device shown in FIG. 5, the conductive bridging memory device 3 of this disclosure exhibits less fluctuation, that is, a more uniform resistive switching performance with fewer changes of resistive switching parameters (see FIG. 6).

Figure 7:
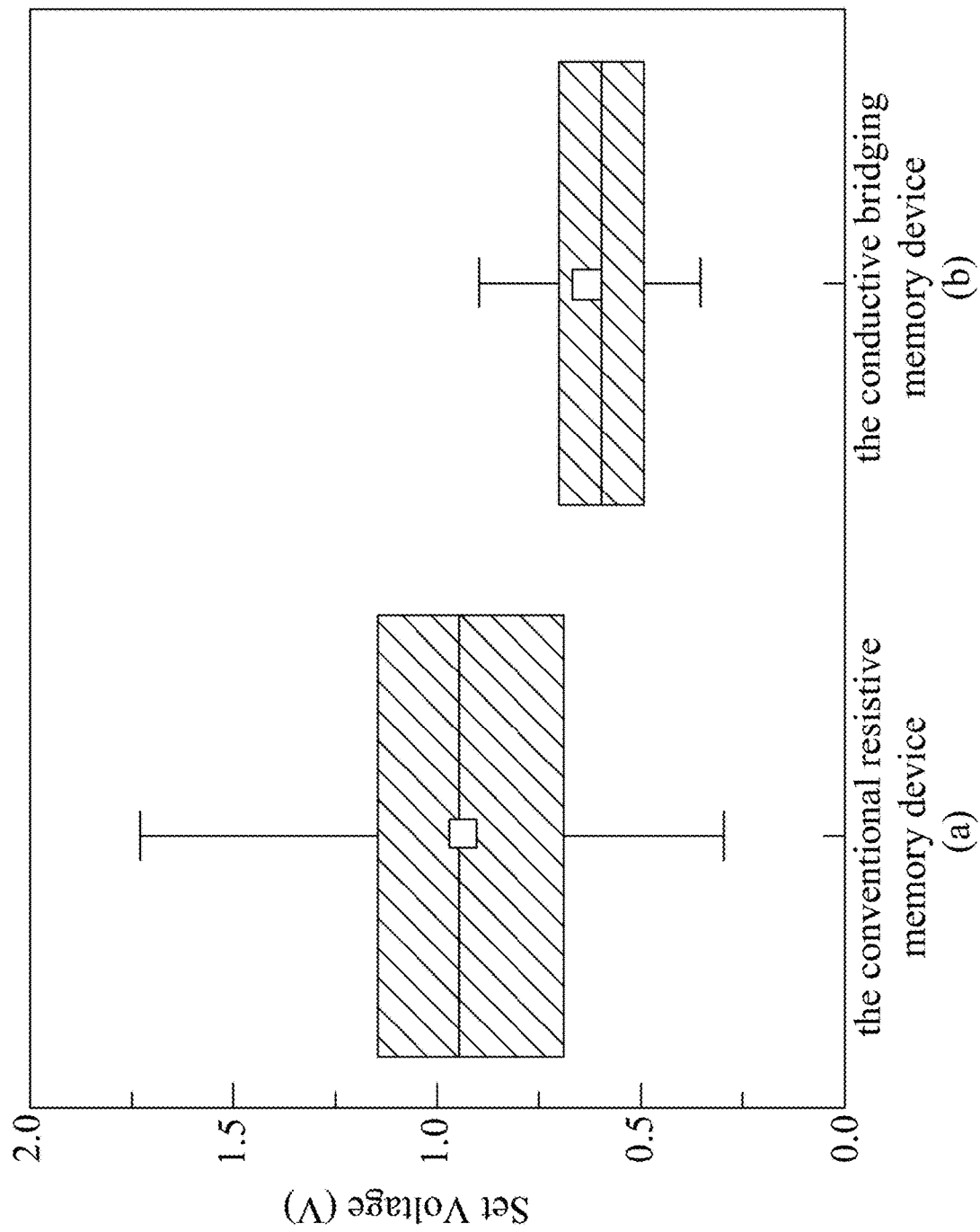
FIG. 7 is a box-and-whisker diagram, showing set voltage of the conventional resistive memory device (a) and the conductive bridging memory device (b) manufactured by the method of this disclosure.

In addition, as shown in FIG. 7, compared with the conventional resistive memory device, the conductive bridging memory device 3 of this disclosure exhibits a relatively smaller set voltage with less deviation, indicating that the oxygen plasma surface treatment can improve the stability of the conductive bridging memory device 3, which is conducive for the operation of writing information under lower voltage.

Figure 8:
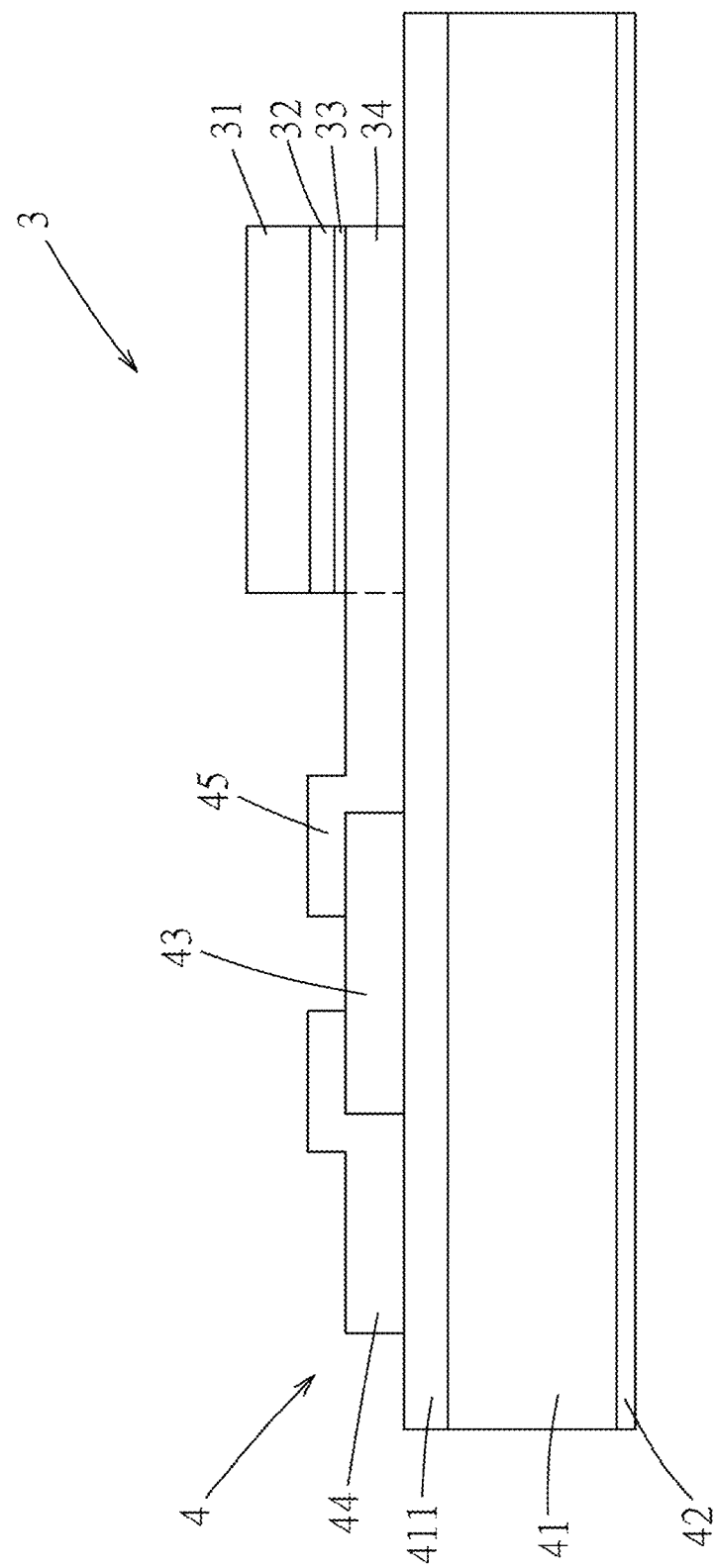
FIG. 8 is a schematic diagram illustrating a one-transistor one-resistor structure including the conductive bridging memory device according to the disclosure connected to a thin film transistor.

Referring to FIG. 8, an embodiment of the conductive bridging memory device 3 manufactured by the method according to the disclosure is connected to a thin film transistor 4 to form a one-transistor one-resistor (1T1R) structure which is adapted to be applied in a display device. The thin film transistor 4 includes a transistor substrate 41, a dielectric layer 411 formed on the transistor substrate 41, a gate electrode 42 formed on the transistor substrate 41 opposite to the dielectric layer 411, and a channel layer 43, a source electrode 44 and a drain electrode 45 which are respectively disposed on the dielectric layer 411.

In this case, the source electrode 44 and the drain electrode 45 are disposed on the channel layer 43, and the upper electrode 34 of the conductive bridging memory device 3 serves as the drain electrode 45 of the thin film transistor 4, such that the conductive bridging memory device 3 is electrically connected in series to the thin film transistor 4. As such, the resultant 1T1R structure is simple and is favorable to be applied in the display device.

In sum, by virtue of subjecting the surface of the switching layer 32 to the oxygen plasma surface treatment, the amount of oxygen vacancies on the surface of the switching layer 32 is reduced, and the difference in the of amount of oxygen vacancies between the surface and interior of the switching layer 32 is reduced, such that overshooting can be greatly avoided when the conductive bridging memory device 3 is subjected to an external bias voltage, thereby improving the durability of the conductive bridging memory device 3. In addition, the conductive bridging memory device 3 produced by the method of this disclosure can have a more uniform resistance switching performance and less fluctuation of resistive switching parameters.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A method for manufacturing a conductive bridging memory device, comprising the steps of:
   (a) forming a bottom electrode on a substrate;
   (b) forming a switching layer on the bottom electrode, the switching layer including a surface region and an interior region each of which is made of a semiconducting metal oxide and free of gallium;
   (c) after forming the switching layer, subjecting the surface region of the switching layer to an oxygen plasma surface treatment;
   (d) forming a blocking layer on the treated surface region of the switching layer, the blocking layer including a conductive material; and
   (e) forming an upper electrode on the blocking layer,
   wherein before the oxygen plasma surface treatment, an amount of oxygen vacancies at the surface region is greater than an amount of oxygen vacancies at the interior region, and
   wherein a difference between an amount of oxygen vacancies at the surface region and an amount of oxygen vacancies at the interior region after the oxygen plasma surface treatment is less than a difference between the amount of oxygen vacancies at the surface region and the amount of oxygen vacancies at the interior region before the oxygen plasma surface treatment.

2. The method of claim 1, wherein in step (c), the surface region of the switching layer is exposed to an oxygen plasma which is generated by subjecting a reactant gas mixture that includes oxygen to an electric field in a vacuum environment.

3. The method of claim 2, wherein oxygen is present in an amount that ranges from 8% to 34% based on the total volume of the reactant gas mixture.

4. The method of claim 2, wherein the electric field is provided by applying a power level that ranges from 120 W to 180 W.

5. The method of claim 2, wherein the vacuum environment has a pressure of not greater than $5 \times 10^{-1}$ Torr.

6. The method of claim 2, wherein the oxygen plasma surface treatment is conducted for a time period ranging from 60 seconds to 150 seconds.

7. The method of claim 2, wherein the oxygen plasma surface treatment is conducted at a temperature ranging from 80° C. to 120° C.

8. The method of claim 1, wherein the bottom electrode, the switching layer, the blocking layer, and the upper electrode are formed by sputtering deposition.

9. The method of claim 1, wherein the semiconducting metal oxide for making the switching layer includes indium tungsten zinc oxide.

10. The method of claim 9, wherein the indium tungsten zinc oxide is amorphous.

11. The method of claim 1, wherein the switching layer has a thickness ranging from 8 nm to 12 nm.

12. The method of claim 1, wherein the bottom electrode includes a first metallic material selected from the group consisting of platinum, palladium, and tungsten.

13. The method of claim 12, wherein the conductive material for making the blocking layer is selected from the group consisting of titanium tungsten, titanium, and titanium nitride.

14. The method of claim 13, wherein the upper electrode includes a second metallic material selected from the group consisting of copper, silver, and gold.

15. The method of claim 1, wherein in step (b), the switching layer is formed by sputtering deposition.

* * * * *